United States Patent [19]
Hayashi et al.

[11] Patent Number: 5,972,428
[45] Date of Patent: Oct. 26, 1999

[54] METHODS AND APPARATUS FOR MATERIAL DEPOSITION USING PRIMER

[75] Inventors: Shinichiro Hayashi; Larry D. McMillan, both of Colorado Springs, Colo.; Masamichi Azuma, Osaka, Japan; Carlos A. Paz de Araujo, Colorado Springs, Colo.

[73] Assignees: Symetrix Corporation, Colorado Spring, Colo.; Matsushita Electronics Corporation, Japan

[21] Appl. No.: 08/611,414

[22] Filed: Mar. 5, 1996

[51] Int. Cl.$^6$ ............................... C23C 16/00; B05D 1/02
[52] U.S. Cl. ........................ 427/252; 427/251; 427/421
[58] Field of Search ................................ 427/251, 252, 427/421

[56] References Cited

U.S. PATENT DOCUMENTS

| | | | |
|---|---|---|---|
| 5,648,114 | 7/1997 | Paz De Araujo et al. | 427/126.3 |
| 5,688,565 | 11/1997 | McMillan et al. | 427/565 |
| 5,719,417 | 2/1998 | Roeder et al. | 257/295 |
| 5,723,171 | 3/1998 | Cuchiaro et al. | 427/96 |
| 5,759,923 | 6/1998 | McMillan et al. | 438/788 |
| 5,843,516 | 12/1998 | Derbenwick et al. | 427/96 |

*Primary Examiner*—C. H. Kelly
*Attorney, Agent, or Firm*—Duft, Graziano & Forest, P.C.

[57] ABSTRACT

A liquid primer is misted, flowed into a deposition chamber and deposited on a substrate. A liquid precursor is then misted, flowed into a deposition chamber and deposited on the substrate. The primer and precursor are dried to form a solid thin film, which is then annealed to form a part of an electronic component in an integrated circuit, such as the dielectric in a memory cell. The primer is a solvent, and the precursor includes a metal carboxylate, a metal alkoxide, or a metal alkoxycarboxylate in a precursor solvent. Preferably, the primer and the precursor solvent are the same solvent, such as 2-methoxyethanol, xylenes, or n-butyl acetate.

44 Claims, 8 Drawing Sheets

METHODS AND APPARATUS FOR MATERIAL DEPOSITION USING PRIMER

BACKGROUND OF THE INVENTION

1. Field of the Invention

The invention relates to methods for depositing high quality films of complex (compound) materials on substrates, and apparatus for effecting such methods. More particularly, the invention relates to fabrication of integrated circuits by applying a liquid precursor to a wafer, and then drying the applied liquid to form an integrated circuit component.

2. Description of the Related Art

The prior art methods for depositing thin films of complex compounds such as metal oxides for ferroelectric and high dielectric constant applications in integrated circuits include: vacuum evaporation (i.e., E-beam, laser ablation, etc.); vacuum sputtering (i.e., E-beam, D.C., R.F., ion-beam, etc.); powder metallurgy; reactive chemical vapor deposition, including metalorganic chemical vapor deposition (MOCVD); and liquid application methods using sol-gels (alkoxides) or carboxylates. However, none of these known methods have been able to produce metal oxides with properties good enough for use in integrated circuits. For example, metal oxides produced for ferroelectric applications all fatigued rapidly and metal oxides produced for high dielectric constant applications all had excessive leakage currents. Moreover, none of the prior art processes, except sputtering, could produce films thin enough for integrated circuits and the films produced had significant physical defects, such as cracking, peeling, etc. It was impossible with the prior art processes, particularly sputtering, to reliably and repeatably produce metal oxides with a specific stoichiometry within tolerances required for integrated circuits. Some processes, like CVD, could be dangerous or toxic. All required high temperatures that were destructive to an integrated circuit, and provided poor "step coverage" of a substrate to be covered; i.e., the prior art techniques resulted in a relatively excessive build-up of deposition of the film at the boundary of any discontinuities on the substrate. In prior art liquid deposition processes, it was impossible to control thickness with the degree of accuracy that is required to manufacture integrated circuits. As a result, up to now, metal oxides have not been used in integrated circuits except for one or two specialty, relatively expensive applications, such as the use of sputtered PZT in ferroelectric integrated circuits that were expected to have short life times.

Recently, a misted deposition method of and apparatus for producing thin films for integrated circuit applications has been described by several of us. See U.S. Pat. No. 5,456,945 issued Oct. 10, 1995. While the method described therein provides great improvement over prior art methods, for thin films of about 1000 Angstroms or less, serious problems in step coverage and the quality of the films occur. Since thinner films permit more compact integrated circuits, it would be highly desirable to have a method and apparatus that produces high quality thin films of complex compounds such as metal oxides, having a thickness less than 1000 angstroms for integrated circuit and other applications.

SUMMARY OF THE INVENTION

The present invention overcomes the many problems and disadvantages associated with known processes by incorporating primer deposition steps into the process described in U.S. Pat. No. 5,456,945. The primer is applied prior to or simultaneously with the deposition of the precursor. An primer mist generator is incorporated into the apparatus.

The invention provides a method of fabricating an integrated circuit, the method comprising the steps of: (a) providing a liquid primer; (b) providing a liquid precursor; (c) placing a substrate inside an enclosed deposition chamber; (d) producing a primer mist of the liquid primer; (e) flowing the primer mist through the deposition chamber to form a layer of the primer liquid on the substrate; (f) producing a precursor mist of the liquid precursor; (g) flowing the precursor mist through the deposition chamber to form a layer of the precursor liquid on the substrate; (h) treating the liquid layers deposited on the substrate to form a film of solid material; and (i) completing the fabrication of the integrated circuit to include at least a portion of the film of solid material in a component of the integrated circuit. Preferably, the liquid primer comprises a primer solvent selected from the group: 2-methoxyethanol, xylenes, and n-butyl acetate. Preferably, the precursor comprises a metal compound in a precursor solvent, the metal compound selected from the group: a metal alkoxide and a metal carboxylate, and a metal alkoxycarboxylate. Preferably, the precursor solvent is the same as the primer solvent. Preferably, the step of flowing the primer mist into the deposition chamber is performed while maintaining the substrate at ambient temperature, and while maintaining a vacuum in the deposition chamber. Preferably, the steps of flowing the primer mist into the deposition chamber and flowing the precursor mist into the deposition chamber are performed simultaneously. Preferably, the vacuum is between approximately 100 Torr and 800 Torr. Preferably, the method further includes the step of filtering the primer mist prior to the step of flowing. Preferably, the step of flowing comprises injecting the primer mist into the deposition chamber in close proximity to and around the periphery of one side of the substrate and exhausting the primer mist from the deposition chamber at a region in close proximity to and around the periphery of an opposite side of the substrate to create a substantially evenly distributed flow of the primer mist across the substrate. Preferably, the method includes the additional step of mixing a plurality of different primer mists external of the deposition chamber to form a primer mist mixture to be flowed into the deposition chamber. Preferably, the method also includes the additional step of applying ultraviolet radiation to one of the primer mist and the precursor mist while the mist is flowing through the deposition chamber. Preferably, the step of treating comprises applying ultraviolet radiation to one of the primer layer and the precursor layer deposited on the substrate. Preferably, the step of producing a primer mist comprises ultrasonically vibrating a quantity of the liquid primer to form the primer mist. Preferably, the step of ultrasonically vibrating comprises adjusting the particle size of the primer mist by controlling one of the frequency and amplitude of the ultrasonic vibration. Preferably, the step of producing a precursor mist comprises ultrasonically vibrating a quantity of the liquid precursor to form the precursor mist, and the step of ultrasonically vibrating comprises adjusting the particle size of the precursor mist by controlling one of the frequency and amplitude of the ultrasonic vibration. Preferably, the step of treating includes one or more steps from the group of drying, heating and annealing the layer deposited on the substrate. Preferably, the step of treating comprises drying the liquid primer and the liquid precursor layers deposited on the substrate. Preferably, the step of drying comprises maintaining a sub-atmospheric pressure in the deposition chamber.

In another aspect, the invention provides a method of fabricating an integrated circuit, the method comprising the steps of: (a) providing a liquid primer; (b) providing a liquid precursor; (c) placing a substrate inside an enclosed deposition chamber; (d) producing a primer mist of the liquid primer; (f) producing a precursor mist of the liquid precursor; (e) flowing the mists through the deposition chamber to form a liquid mixture of the primer and precursor on the substrate; (h) treating the liquid mixture deposited on the substrate to form a film of solid material; and (i) completing the fabrication of the integrated circuit to include at least a portion of the film of solid material in a component of the integrated circuit.

In another aspect the invention provides an apparatus for fabricating an integrated circuit, the apparatus comprising: (a) a deposition chamber; (b) a substrate holder located within the deposition chamber; (c) means for producing a mist of a liquid primer; (d) means for producing a mist of a liquid precursor; (e) means for flowing the primer mist and the precursor mist through the deposition chamber to form a liquid layer on the substrate, the liquid layer comprising the primer liquid and the precursor liquid; and (h) means for treating the liquid layer deposited on the substrate to form a film of solid material on the substrate.

The use of a primer prior to the deposition of the metal oxide results in metal oxide films that show better surface morphology and dielectrics having lower leakage current. Excellent quality thin films of complex compounds can be fabricated with half or even a third of the thickness of the thinnest high-quality films that could be fabricated with prior processes and apparatus. Other objects, advantages and salient features of the present invention will become apparent from the following detailed description in conjunction with the drawings.

DESCRIPTION OF THE PREFERRED EMBODIMENT

1. Overview

Figure 6:
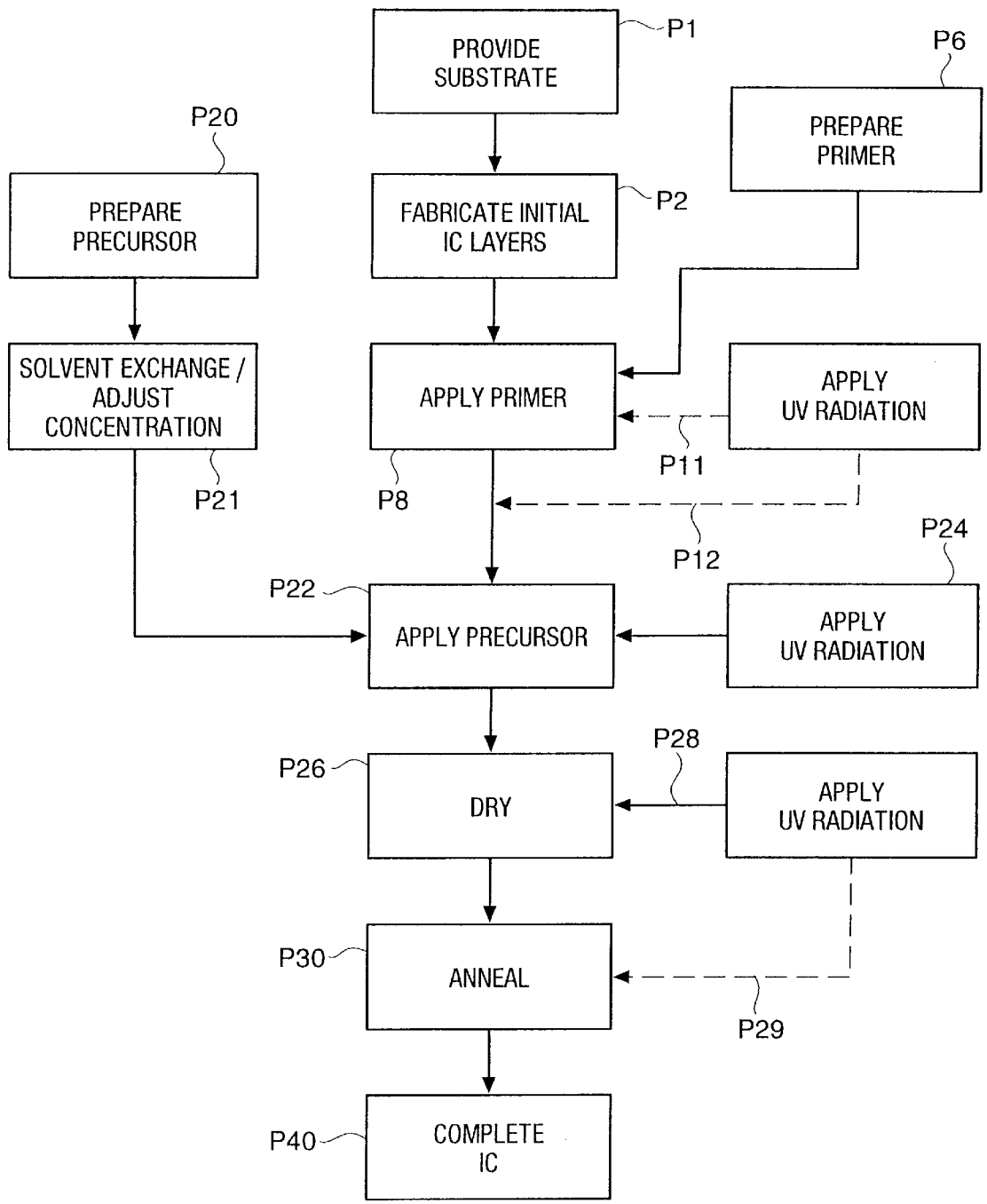
FIG. 6 is a flow chart showing the process of fabricating an integrated circuit according to the invention.
Figure 11:
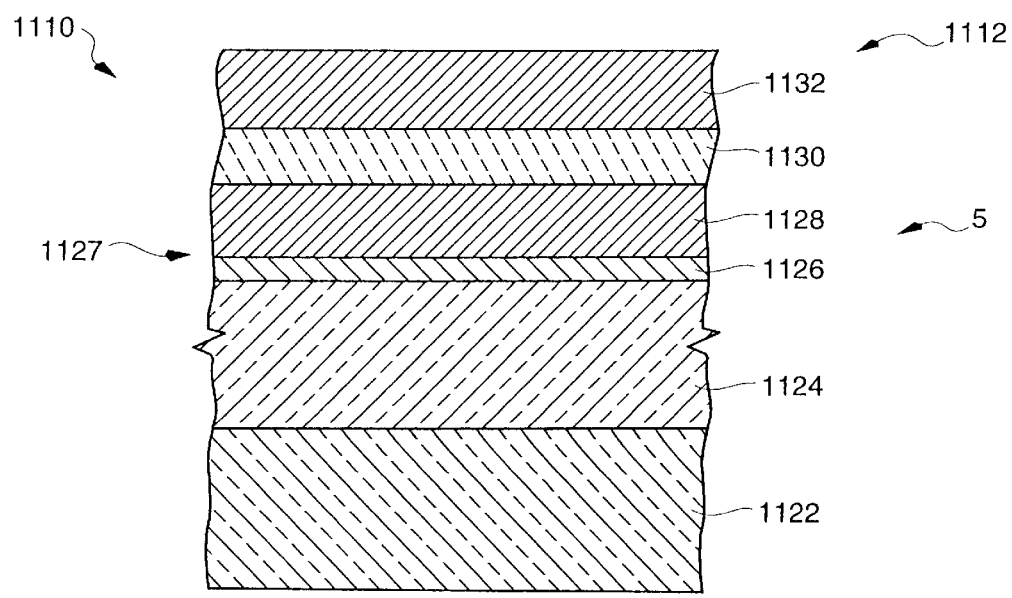
FIG. 11 shows a cross-sectional side view of a portion of an integrated circuit wafer fabricated with the apparatus and methods of the invention.

A flow chart of the preferred embodiment of a process according to the invention is shown in FIG. 6 and a portion of an integrated circuit made by the process is shown in FIG. 11. In step P1 a substrate 5 is provided. In the art, the term "substrate" is used both in a general sense in which it may be any one or a number of layers 5 of material on which a layer of interest 1130 is deposited, and in a special sense in which it denotes a silicon wafer 1122 on which an integrated circuit 1110 is formed. Unless the context indicates otherwise, the word substrate herein will indicate any object on which a layer of material is deposited using the process and apparatus of the invention. The substrate referred to as being provided in step P1 preferably comprises a P-type silicon wafer 1122. In step P2, the initial integrated circuit layers 1124, 1126, and 1128 are fabricated to form a substrate 5 on which a metal oxide layer 1130 is deposited. First, an approximately 5000 Å silicon dioxide insulating layer 1124 is wet grown. Typically, the $SiO_2$ layer is etched to form the shape necessary to create a given integrated circuit device 1112 upon deposition of appropriate layers of titanium 1126, platinum 1128, dielectric 1130, and platinum 1132. The bottom electrode 1127 comprises a thin layer 1126 of titanium metal deposited on the silicon dioxide 1124, preferably by sputtering in situ, and a 2000 Å thick electrode of platinum deposited on the titanium 1126, preferably by sputtering in situ. By "in situ" is meant that both the titanium and the platinum are sputtered without breaking vacuum. The titanium layer 1126 is optional. When used, it diffuses into the silicon dioxide and platinum and assists the platinum 1128 in adhering to the silicon dioxide 1124. A layer 1130 of a material such as PZT or BST is then deposited utilizing the apparatus and methods of the invention discussed below. Another 2000 Å layer 1132 of platinum is deposited on the layer 1130. The wafer 1110 is then annealed, patterned with a photo-mask process, and etched down to the electrode layer 1128 to produce capacitor integrated circuit devices 1112, one of which is shown in cross-section in FIG. 11, which devices are tested by connecting one lead of the test device to the platinum electrode layer 1128 and contacting the other electrode layer 1132 with a fine probe connected to the other lead of the test device.

In step P6 a primer is prepared. In the preferred embodiment, this step comprises providing a quantity of a single solvent, such as 2-methoxyethanol, xylenes or n-butyl acetate, though it may include the step of combining several solvents, such as the three foregoing solvents. The preferred solvent, whether it be a single solvent or a combination of solvents, is the final solvent of the precursor, that is, the solvent of the precursor that is applied in step P22, which will be described below. Some solvents that may be used as the primer, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

In step P8 the primer is applied to the substrate 5. In the preferred embodiment, to be described in detail below, the primer is misted, is screened through a mesh filter 310, and is applied to the substrate 5 in a deposition chamber 12. The term "mist" as used herein is defined as fine drops of a liquid carried by a gas. The term "mist" includes an aerosol, which is generally defined as a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text Aerosol Science and Technology, by Parker C. Reist, McGraw-Hill, Inc., New York, 1983, which is hereby incorporated by reference. The term "mist" as used herein is intended to be broader than the term aerosol, and includes suspensions that may not be included under the term aerosol, vapor, or fog. Ultraviolet (UV) radiation may be applied to the primer mist as it flows into and through the deposition chamber 11, or after it is applied to the substrate 5, as shown by the dotted lines P11 and P12, respectively. However, in the preferred embodiment, these steps P11 and P12 are skipped.

It has been found that the use of a primer prior to the deposition of the precursor results in films having better morphology and lower leakage current than with no use of a primer step P8.

In step P20 a precursor liquid is prepared. The precursor is preferably a metal-alkoxycarboxylate prepared as described in U.S. patent application Ser. No. 08/132,744, which is hereby incorporated by reference, and one detailed example thereof is given below. The precursor prepared in step P20 is usually prepared in quantity and stored until needed. Just before application of the precursor, a solvent exchange step, a concentration adjustment step, or both is performed to provide an optimum precursor for the application. The solvent exchange step is described in detail in U.S. patent application Ser. No. 08/165,082, which is hereby incorporated by reference. The final precursor solution is preferably used as the sole source for the entire deposition process following the application of the primer. However, the invention also contemplates using multiple precursor sources in parallel or series. In particular, other sources may be used in parallel for doping or modifying the final desired compound.

The precursor liquids used in the present invention are stabilized solutions. Here, "stabilized" means that key oxygen-metal bonds of the desired final chemical compound are formed in the process of forming the precursor, and after such formation are stable. This has two aspects. First, the solutions do not react or deteriorate when stored over moderately long periods. Second, the bonds formed when forming the precursor remain stable throughout the deposition process and form at least a portion of the bonds in the final desired chemical compound. That is, the metal-oxygen bonds in the precursor remain stable and pass through the deposition process to form the metal-oxygen bonds of the final desired metal-oxide compound.

According to the method of the present invention, the screened mist of a precursor liquid is evenly flowed across and onto a substrate 5 at ambient temperature. Herein, ambient temperature means the temperature of the surroundings. That is, no additional heat, other than the heat from the surroundings, is applied to the substrate. When UV radiation is being applied, the temperature of the surroundings will be somewhat higher than room temperature, and when no UV radiation is being applied and a vacuum is being applied to treat the substrate, the ambient temperature can be somewhat less than room temperature. Based on the above, in general, ambient temperature may be between about −50° C. and 100° C. Preferably ambient temperature is between about 15° C. and 40° C.

As will be discussed further below, a key aspect of the flow process is that the mist is flowed across the substrate 5 via multiple input ports and exits the area above the substrate 5 via multiple exhaust ports, with the ports being distributed in close proximity to and about the periphery of the substrate 5 to create a substantially evenly distributed flow of mist across the substrate 5.

During, after, or both during and after deposition, the precursor liquid is treated to form a thin film of solid material on the substrate 5. In this context, "treated" means any one or a combination of the following: exposed to vacuum, ultraviolet radiation, electrical poling, drying, heating, and annealing. In the preferred embodiment UV radiation is applied to the precursor solution during deposition in step P24. The ultraviolet radiation is preferably also applied after deposition in step P28. After deposition, the material deposited on the substrate 5, which is liquid in the preferred embodiment, is also preferably exposed to vacuum for a period, then is heated, and then annealed. The chemistry of the UV cure process is not entirely understood. It is believed that the UV assists in disassociating the metal-oxide molecules, or other elements that comprise the desired final chemical compound, from the solvent and the organics or other fragments of the precursor compounds.

An important parameter of many complex thin films, such as ferroelectric films, is that they are generally required to be quite thin (for example, within a range of 200 angstroms–5000 angstroms). Such film thicknesses can be readily achieved by the process and apparatus according to the invention. The invention can also be used to generate much thicker films, if desired.

The invention is well-suited for the deposition of high quality thin films of compounds such as ferroelectrics, super-conductors, materials with high dielectric constants, and gems, etc. For example, the invention can be used to deposit thin films of ferroelectric materials having a general composition of $ABO_3$, including $PbTiO_3$, $Pb_xZr_yTiO_3$, $Pb_xLa_yZr_zTiO_3$, and $YMnO_3$, where Y represents any rare-earth element. In addition, the invention can also be used to deposit thin films of barium strontium titanate [(Ba,Sr)$TiO_3$], strontium titanate ($SrTiO_3$), as well as other multi-element compounds, such as those described in U.S. patent application Ser. No. 965,190, filed on Oct. 23, 1992, titled "Layered Superlattice Materials for Ferroelectric, High Dielectric Constant, and Integrated Circuit Fabrication", which is hereby incorporated by reference.

2. Deposition Apparatus

Figure 1:
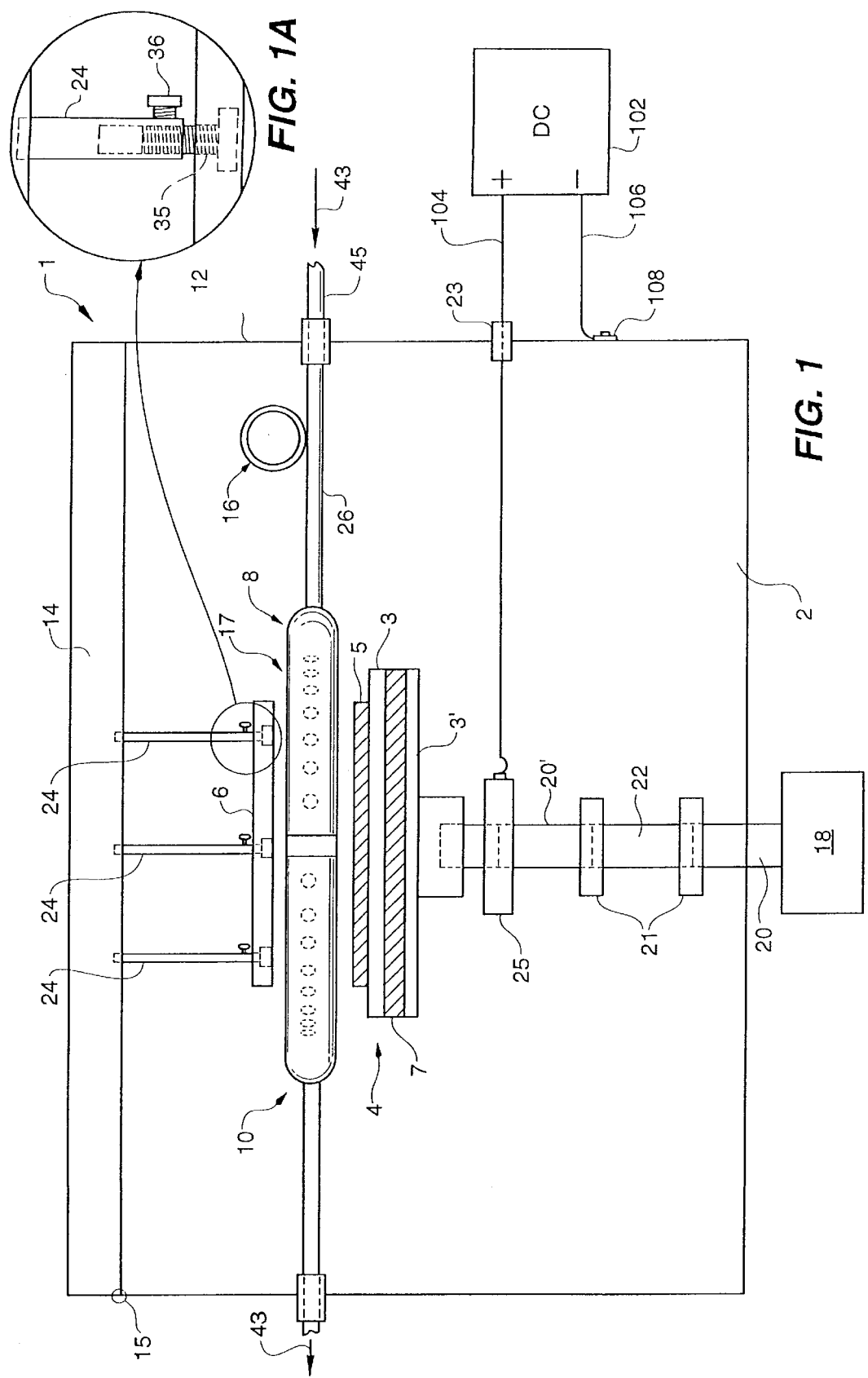
FIG. 1 is a cutaway side view of the deposition chamber portion of a misted deposition system according to the invention.

As shown in FIG. 1, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 18. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material 7, such as delrin. In an exemplary embodiment, utilizing a 5 inch diameter substrate 5, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected across main body 12 of deposition chamber 2 at connection 108 by lead 106 and via feedthrough 23 to brass sleeve 25 by lead 104 to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate 5. It has been found that the best results are obtained if the area of barrier plate 6 in a plane parallel to the substrate varies from the area of the substrate 5 by 10% or less. That is, the area of the barrier plate 6 is no more than 10% bigger than the area of substrate 5 nor no less than 10% smaller than the area of substrate 5. As depicted in FIG. 1, the barrier plate 6 is preferably connected to the lid 14 by a plurality of rods 24 so that the plate 6 will be moved away from the substrate 5 whenever the lid is opened.

Figure 8:
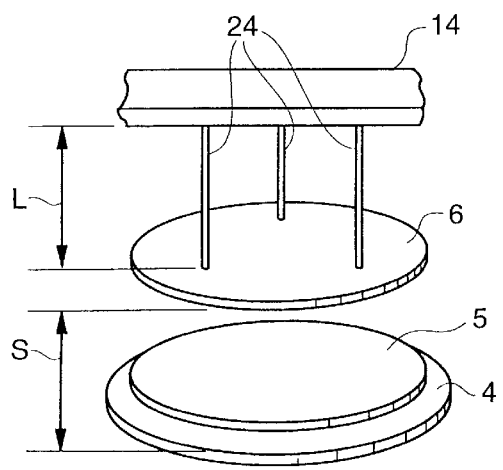
FIGS. 8 and 9 show a barrier plate assembly and substrate in two different positions to illustrate the adjustable relationship between the barrier plate and the substrate.
Figure 9:
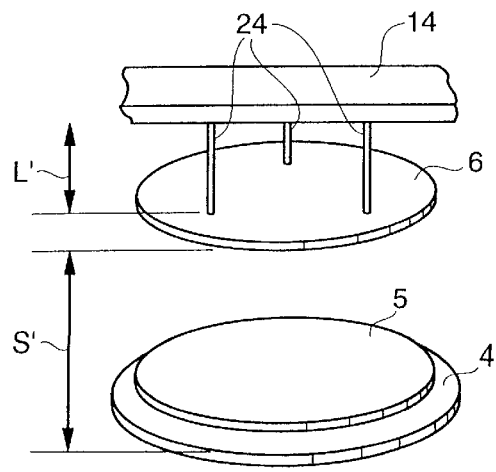

FIGS. 8 and 9 show barrier plate 6 located at various distances from substrate holder 4. Each of the rods 24 is typically a stainless steel rod attached to deposition chamber lid 14. Each rod 24 is bored to accommodate a bolt 35 (FIG. 1) by which the rod 24 is attached to barrier plate 6. Each rod 24 is tapped to accommodate a set screw 36 which secures bolt 35 to the rod 24. By loosening set screw 36, re-positioning rod 24 relative to bolt 35, and then re-tightening set screw 36, the effective length of each rod is adjustable up to ½ inch without having to remove the rod 24 from the chamber lid 14. Each of the rods 24 is removable to allow sets of rods 24 of different lengths L, L', etc. to be substituted in order to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches.

Once in place, rods 24 are also adjustable as indicated above. Thus, rods 24, bolts 35, and set screws 36 comprise an adjusting means for adjusting the barrier plate 6. The spacing between substrate 5 and barrier plate 6 is preferably approximately between 0.35 inches and 0.4 inches when a precursor liquid of barium strontium titanate, as prepared below, is deposited. Preferably the barrier plate 6 has a smoothness tolerance of up to 5% of the distance between the barrier plate 6 and substrate 5. That is, the distance between the substrate 5 and the barrier plate 6 at any given point differs from the distance between the substrate 5 and the barrier plate 6 at any other point by 5% or less of the average distance between the substrate 5 and the barrier plate 6. For example, if the average distance between the substrate 5 and the barrier plate 6 is 0.38 inches, no point on the substrate will be more than 0.40 inches from the barrier plate or less than 0.36 inches from the barrier plate.

It has been found that a barrier plate within the tolerances described above, that is, the barrier plate has an area that is approximately the same as the substrate and a smoothness tolerance of 5% or less, provides better thickness uniformity and a higher deposition rate than barrier plates outside the aforesaid tolerances.

Figure 7:
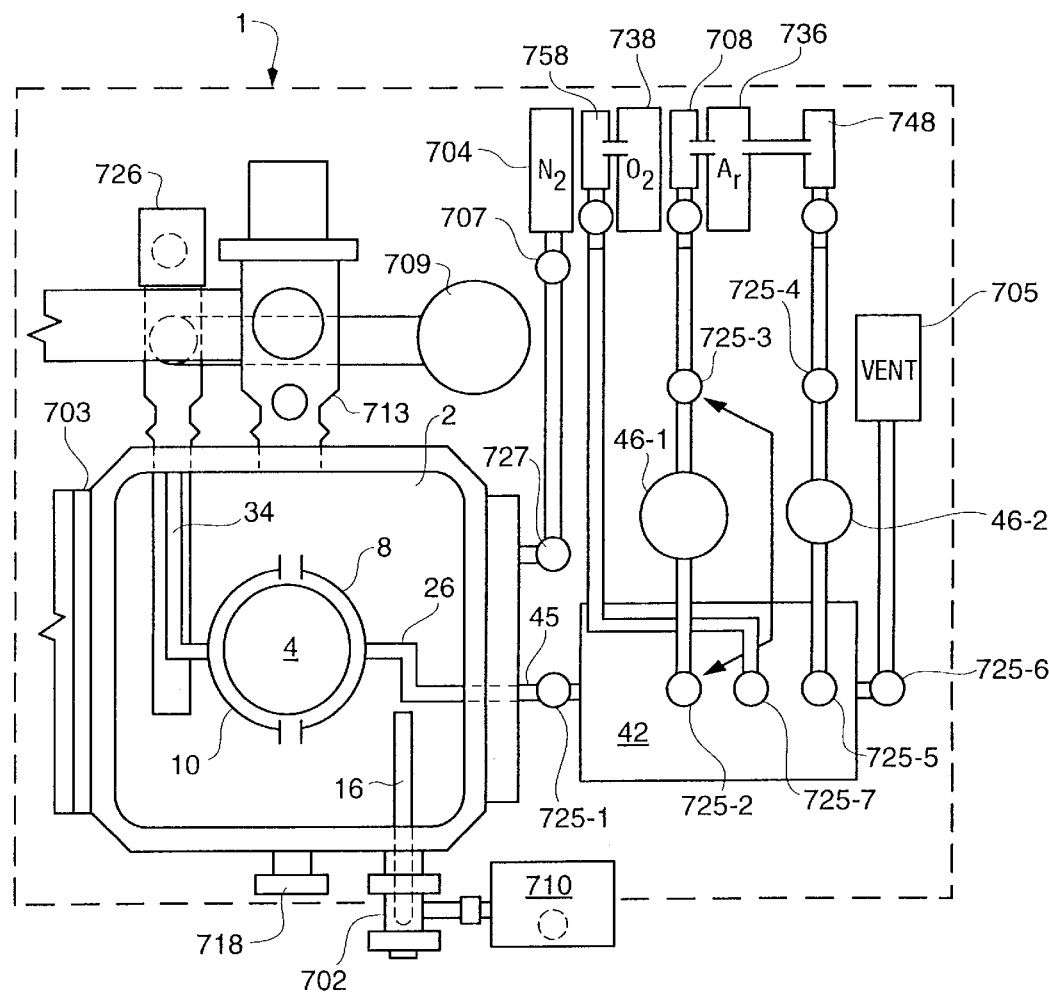
FIG. 7 is a top view of the preferred embodiment of a misted deposition system according to the invention.

FIG. 7 is a top view of the apparatus of an exemplary embodiment of the invention. As shown in FIG. 7, a 0–1000 Torr temperature compensated capacitance manometer 710 monitors the pressure in deposition chamber 2, and its signal controls a downstream control valve (not shown) to maintain precise pressures in deposition chamber 2. High vacuum pump-down of deposition chamber 2 to below $5.0 \times 10^{-6}$ Torr is accomplished with valve 713 opened. High vacuum pump-down of deposition chamber 2 is used to facilitate adsorption of moisture from the chamber walls as well as from a substrate 5 located inside of the chamber, prior to a deposition operation.

Deposition chamber 2 is vacuum pumped to a pressure of between approximately 100 and 800 Torr during a deposition operation. The deposition chamber exhaust system includes a liquid nitrogen cold trap 709 connected to process chamber 2 via valve 726. Access to an external chamber (not shown) from deposition chamber 2 is provided through an air-operated slit valve 703. The interior of deposition chamber 2 can be viewed during a deposition operation through view port 718.

The precursor liquids are provided with mass flow controller 708 and VCR valve 725-3 to control the dispersion rates of precursors through buffer chamber 42 into deposition chamber 2 by regulating the flow of an inert gas such as argon from source 736 into mist generator 46-1. Additional mass flow controller 748 and valve 725-4 are connected to mist generator 46-2 which connects to buffer chamber 42 via VCR valve 725-5 to control the dispersion rates of primers through buffer chamber 42 into deposition chamber 2 by regulating the flow of an inert gas such as argon from source 736 into mist generator 46-2. A separate mass flow controller 758 is used to introduce oxygen from source 738 and/or other inert or process-active gases into buffer chamber 42 via VCR valve 725-7.

Figure 2:
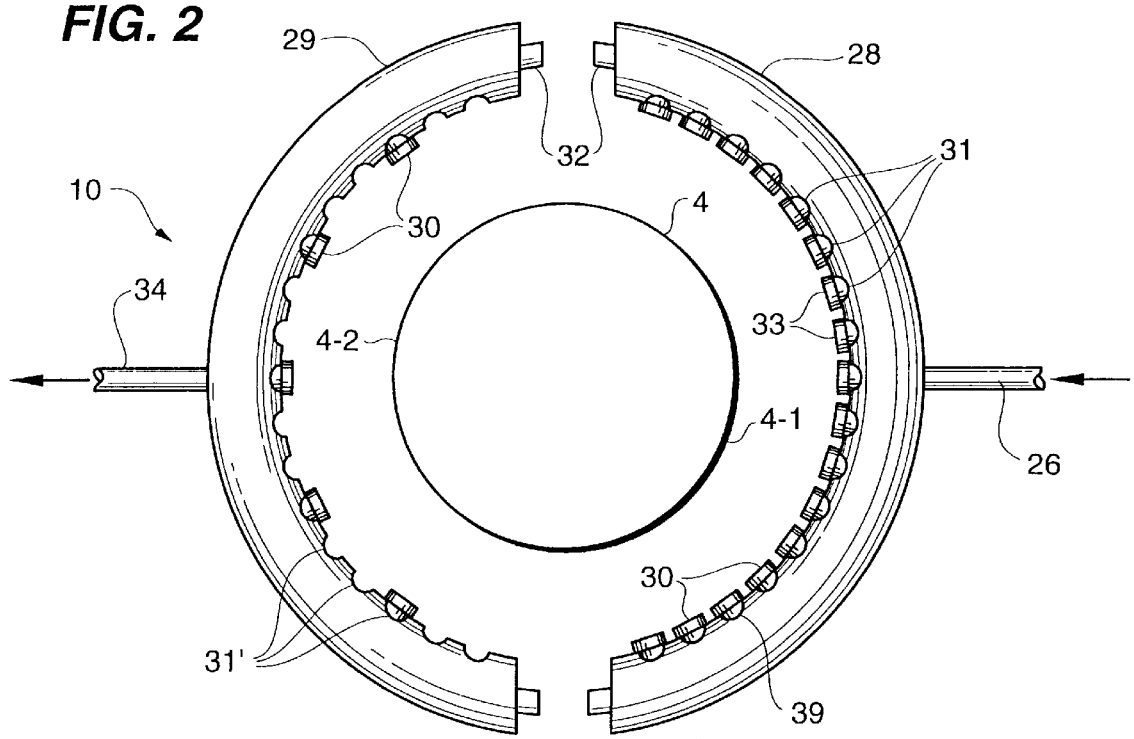
FIG. 2 is a plan view of an intake and exhaust nozzle assembly of the system of FIG. 1.

The input nozzle assembly 8 and the exhaust nozzle assembly 10 are more particularly shown with reference to FIG. 2. Input nozzle assembly 8 includes an input tube 26 which receives a misted solution from buffer chamber 42 as discussed below in relation to FIG. 5. Input tube 26 is connected to arcuate tube 28 which has a plurality of small holes or input ports 31 for accepting removable screws 30 and removable input nozzles 33 spaced ¼ inch center-to-center along the inner circumference of the tube 28.

Figure 3:
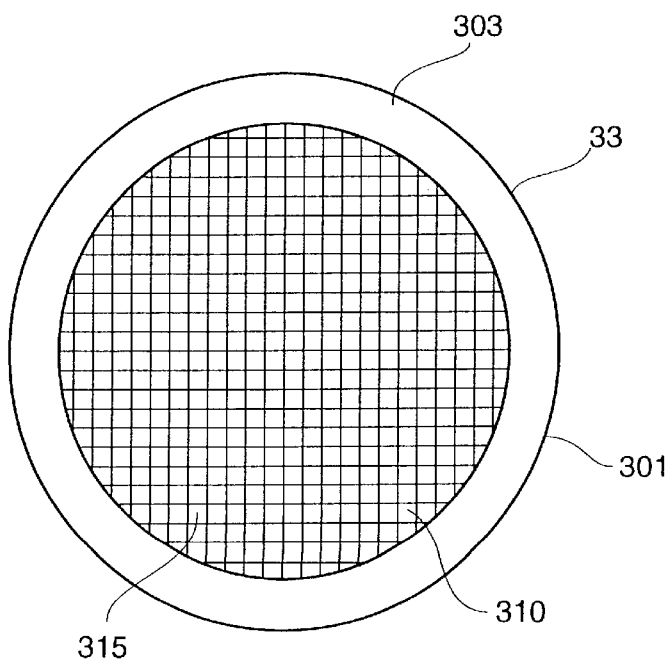
FIG. 3 is an enlarged plan view of an intake nozzle of the system of FIGS. 1 and 2.

A plan view of an input nozzle 33 is shown in FIG. 3. It includes a screw 33 having an enlarged, hollow screw head 301 having a rim 303, and hollow screw stem 39 (FIG. 2), and a mesh filter 310. Mesh filter 310 is preferably friction fit inside screw head 301 before the head 301 is attached to the stem 39, but also may be brazed to the outer surface of rim 303. Preferably, all portions of nozzle 33, including mesh filter 310, are made of stainless steel. Preferably mesh filter 310 is a stainless steel, woven mesh filter having spacings 315 between the mesh strands of approximately one square micron. It has been found that, with everything else being equal, the use of such a mesh filter lowers the deposition rate somewhat, but this is easily overcome by increasing the number of ports 31 and/or the size of the ports. It is believed the filter collimates the mist so that the flow of the mist over the substrate is more uniform and less turbulent, and thus there is less chance of anomalies in the flow appearing, which anomalies can create non-uniformities.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that it does not include input nozzles 33 and a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a BST film is to be deposited, the centers of holes 31, 31' in tubes 28 and 29 are nominally located 0.375 inches above substrate holder 4. However, as shown in FIGS. 8 and 9, this distance is adjustable to suit the specific deposition process.

Each of the tubes 28, 29, is typically fabricated from ¼" O.D. stainless steel, with an inner diameter of approximately 3/16". The interior walls of each tube 28, 29 are preferably electro-polished. Holes 31, 31' in tubes 28 and 29 respectively are spaced approximately ¼" center-to-center, and are tapped to accommodate 4–40 (⅛") socket head screws.

Through such structure, and by adjusting the location of nozzles 33 by selectively inserting nozzles 33 in place of screws 30 in arcuate tube 28, and adjusting the location of open exhaust holes 31' by selectively removing screws 30 in arcuate tube 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 5:
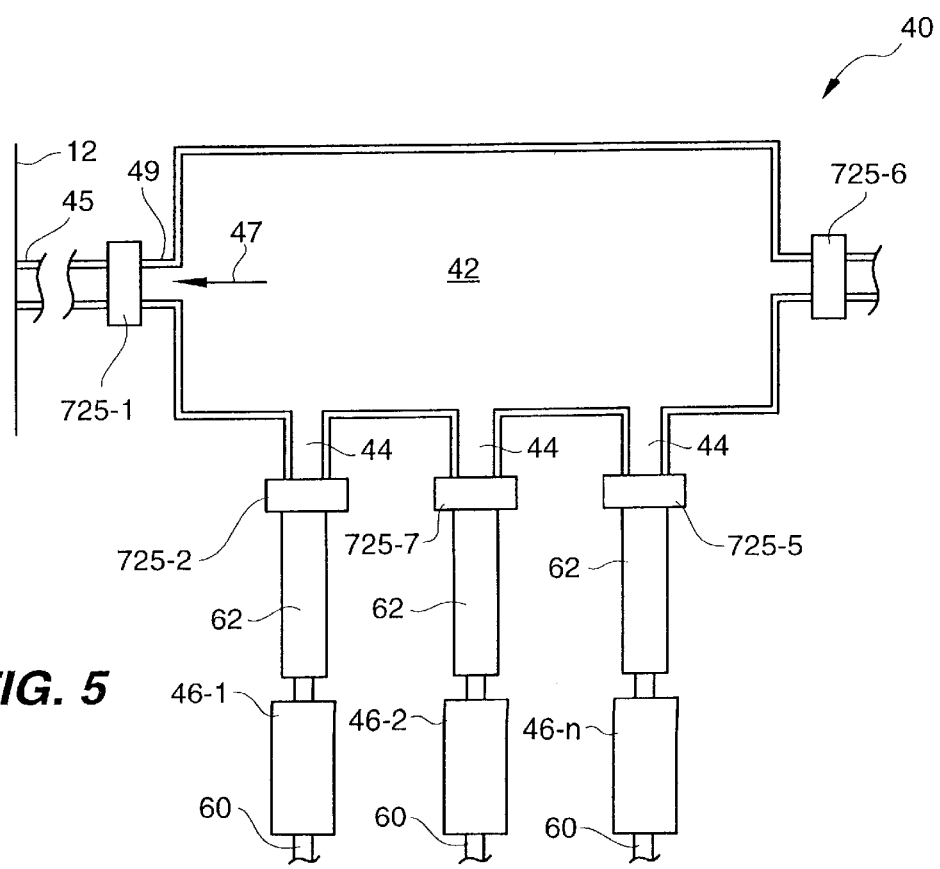
FIG. 5 is a schematic plan view of a buffer chamber and associated inlet and outlet ports according to the invention.

FIG. 5 shows a cross-sectional view of a manifold assembly 40 according to the present invention. The manifold assembly 40 is utilized for supplying a vaporized solution (mist or aerosol) to input nozzle assembly 8, and generally comprises a buffer chamber 42, a plurality of inlets 44 which are connected to corresponding mist generators through respective valves 725-2, 725-5, 725-7, a deposit valve 725-1, for regulating flow from the buffer chamber 42 to the nozzle assembly 8, and an exhaust vent valve 725-6. It is a feature of the invention that the inlets 44 from valves 725-2, 725-5, and 725-7 are at a 90 degree angle from outlet 49 to deposit valve 725-1. Buffer chamber 42 is large enough so that the mists will spend, on the average, about one to five minutes in the chamber, and, preferably, about 2.5 minutes. This time frame and the 90 degree angle between the inlets 44 and outlet 49 permits any large droplets in the mist, which can cause surface morphology problems to settle out, i.e. droplets larger than about two microns. When more than one mist is used at the same time, as for example, when both a primer and precursor are introduced together (see below), it permits the mists to mix until they form a single, homogeneous mist. In the preferred embodiment, buffer chamber 42 was preferably a cylinder of about 3 inches in inside diameter (the vertical direction in FIG. 5) and approximately about four inches long (the horizontal direction in FIG. 5) and was made of stainless steel.

In use, one or more of the mist generators 46-* are utilized to generate one or more different mists which are then flowed into the buffer chamber 42 through valves 725-* and inlets 44.

The mists as flowed into the buffer chamber 42 are mixed to form a single, uniform misted solution which is then flowed into the deposition chamber 2 at an appropriate flow rate through the valve 725-1 and input tube 26. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust/purge one or more of the mist generators 46, valve 725-1 can be closed off, valve 725-6 and one or more of the valves 725-* can be opened, and the buffer chamber 42 can be pumped down to clean and purge the mist generator(s) 46 and the buffer chamber 42 by applying a vacuum via pump (not shown) or using standard negative draw type exhaust.

Stabilized precursor solutions are agitated ultrasonically to atomize or nebulize the solutions to produce a mist of the stabilized precursor solution(s) before they are introduced into the deposition chamber 2. FIG. 4 illustrates a schematic side view of an exemplary embodiment of the mist generating apparatus used in the present invention. Mist generator 46 includes a closed container 54, a TDK TU-26B or equivalent ultrasonic transducer 56 fluid-tightly and vacuum sealed into the bottom of the container 54, and a power source 72 for which both the frequency and amplitude may be varied. Container 54 is a modified Millipore Waferguard T-Line gas filter unit (catalog no. YY50 005 00) without the internal filter cartridge. The direction of gas flow as indicated by arrows 420 is opposite to that which would be used in normal operation of the filter. Transducer 56 is mounted in a recessed hole in bottom section of mist generator 46. Mist generator 46 also includes an inlet port 60 and an outlet port 62 for passing a carrier gas through the container 54. Power source 72 includes a frequency control means, i.e. frequency control dial 73, which can be turned to adjust the frequency of the transducer 56, and an amplitude control means 75, i.e. amplitude control dial 75, which can be turned to adjust the amplitude of the output of transducer 56. By adjusting the frequency and amplitude of the transducer, the particle size of the mist can be controlled. Adjusting the particle size enables one to adjust the surface morphology, step coverage, and deposition rate of the deposition process.

Before operation, a predetermined amount of precursor liquid 64 is introduced into container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations.

Figure 4:
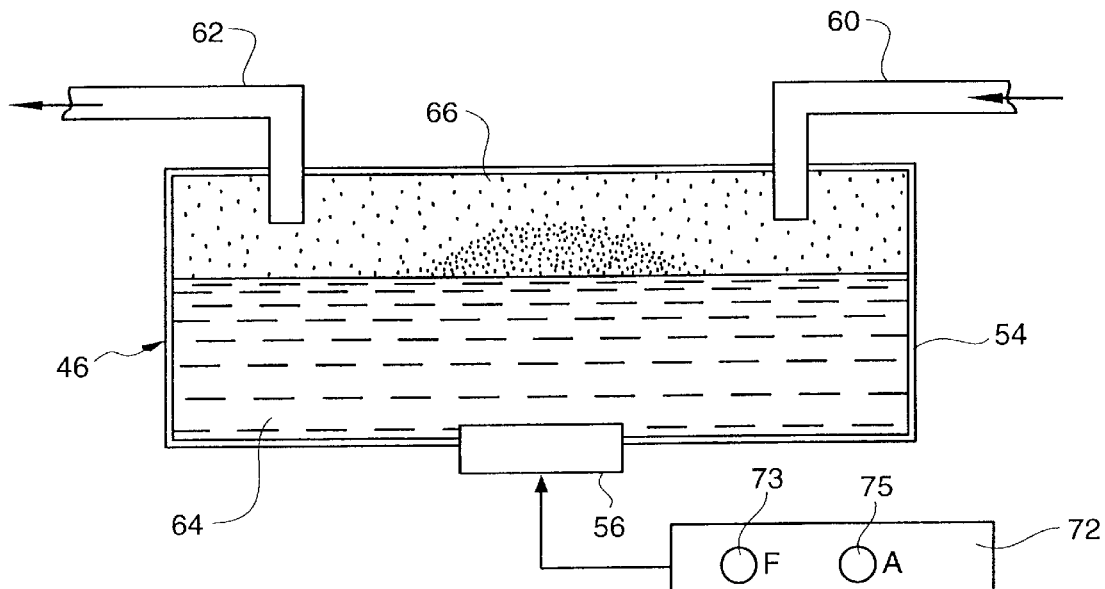
FIG. 4 is a schematic side view of a mist generator of a misted deposition system according to the invention.

The mist generator 46 shown in FIG. 4 is particularly advantageous because it creates a vaporized solution which can be effectively flowed or injected into the deposition chamber 2 without complications such as freezing.

Figure 10:
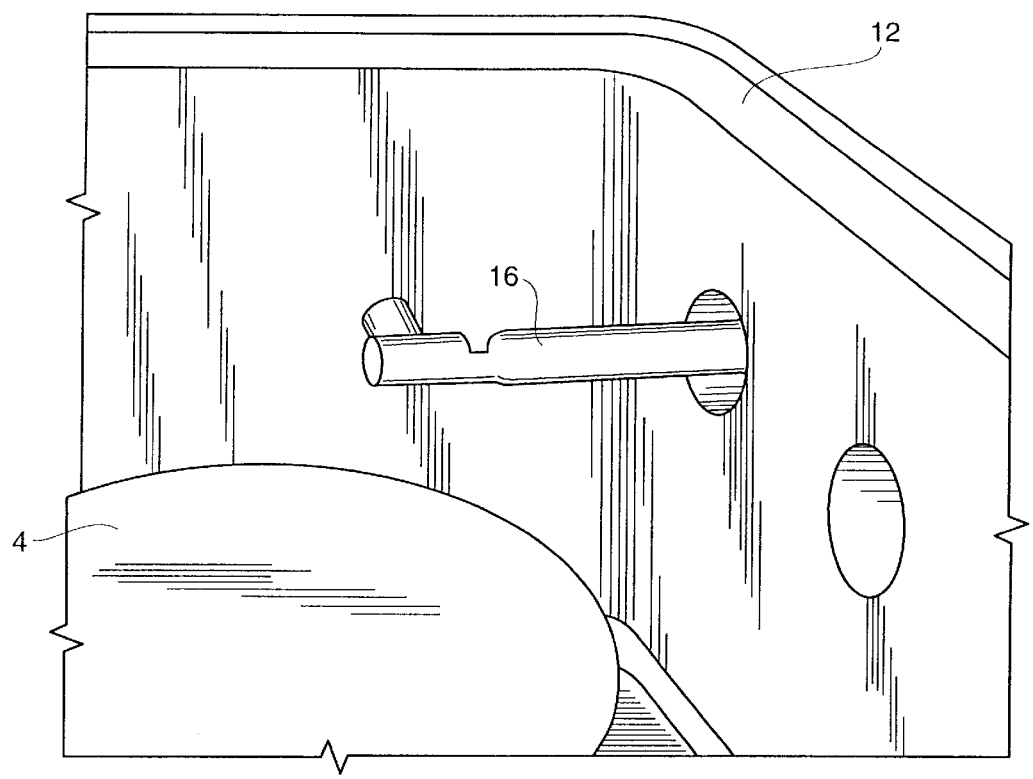
FIG. 10 is a perspective view showing the placement of the ultraviolet radiation source within the deposition chamber according to the invention.

FIG. 10 is a perspective view showing the placement of an ultraviolet radiation source 16 within the deposition chamber 2. Photo-enhancement of the present process is effected by providing UV (ultraviolet) light during and after the deposition process, which UV radiation is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set of) the UV lamps with another one of (or set of) UV lamps which have a more desirable frequency spectrum.

If a ferroelectric thin film is being deposited from a vaporized alkoxycarboxylate source, as for example when depositing a precursor to form barium strontium titanate (BST) as described below, it is preferable to use a Danielson Phototron PSM-275 UV radiation source 16 which emits UV radiation rays having a wavelength of approximately 180–260 nanometers. UV radiation in this wavelength range is particularly effective in resonating and dissociating the bonds holding the BST in the vaporized alkoxycarboxylate, sol-gel, MOD, or other liquid chemical source.

Apparatus 1 shown in FIG. 1 includes electrical means 102 for applying a DC bias in the deposition chamber 2 during a deposition operation. Electrical means 102 includes DC input 104 and output 106. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems. A DC bias of either greater than or less than 350 volts could also be used to effectuate the above results. In addition, while deposition is occurring, combinations of ultraviolet radiation and DC bias may be applied within chamber 2 either together or sequentially, and repeated.

A supplemental heating means, such as a hot plate, (not shown) may be used to bake and/or anneal a film of a precursor liquid which has previously been deposited on a substrate, the baking and annealing being preferably conducted in an auxiliary chamber, although the baking/annealing process could be performed within the deposition chamber 12, as discussed in relation to steps $P_{11}$ and $P_{12}$ of FIG. 6. The annealing is preferably performed in an oxygen furnace. High energy density ultraviolet radiation, such as from a diffused excimer laser source is also a preferred method of annealing.

3. Examples of the Process

A detailed example of the process of preparing barium strontium titanate (BST) precursors and fabricating a capacitor utilizing BST as the capacitor dielectric follows. In Table I, "FW" indicates formula weight, "grams" the weight in grams,

TABLE I $Ba_{0.7}Sr_{0.3}TiO_3$

| Compound | FW | grams | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 58.945 | 0.60107 |
| Titanium isopropoxide | 284.26 | 27.878 | 98.072 | 1.0000 |

"mmoles" indicates millimoles, and "Equiv." indicates the equivalent number of moles in solution. The quantities of materials as indicated in Table I were measured to begin step P20 (FIG. 6). The barium was placed in 100 ml of 2-methoxyethanol and allowed to react. The first measure of 2-ethylhexanoic acid was added to the mixture and stirred. The strontium was then added to the mixture. Once it was finished reacting, the second measure of the 2-ethylhexanoic acid was added to the mixture. The mixture was heated to a maximum temperature of 115° C. and stirred to distill out all water. The mixture was allowed to cool. The titanium isopropoxide was added to the mixture, which was then diluted to 220 ml with additional 2-methoxyethanol. The mixture was heated to a maximum temperature of 116° C. and stirred. All isopropanol and water were then distilled out to complete step P20. In step P21, the mixture was then diluted out to exactly 200 ml with additional 2-methoxyethanol. The resultant mixture had a 0.490M concentration, wherein the ratio of Ba to Sr=0.69986:0.30014.

The chemical reactions involved in the formation of the precursor solution composed of barium 2-ethylhexanoate, strontium 2-ethylhexanoate, and titanium 2-methoxyethoxide are described below:

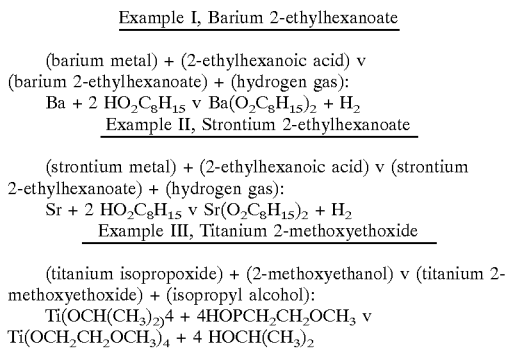

Example I, Barium 2-ethylhexanoate (barium metal) + (2-ethylhexanoic acid) v (barium 2-ethylhexanoate) + (hydrogen gas):
$$Ba + 2\ HO_2C_8H_{15}\ v\ Ba(O_2C_8H_{15})_2 + H_2$$

Example II, Strontium 2-ethylhexanoate (strontium metal) + (2-ethylhexanoic acid) v (strontium 2-ethylhexanoate) + (hydrogen gas):
$$Sr + 2\ HO_2C_8H_{15}\ v\ Sr(O_2C_8H_{15})_2 + H_2$$

Example III, Titanium 2-methoxyethoxide (titanium isopropoxide) + (2-methoxyethanol) v (titanium 2-methoxyethoxide) + (isopropyl alcohol):
$$Ti(OCH(CH_3)_2)4 + 4HOPCH_2CH_2OCH_3\ v\ Ti(OCH_2CH_2OCH_3)_4 + 4\ HOCH(CH_3)_2$$

The use of 2-methoxyethanol as a solvent allows removal of any water present by distillation, as 2-methoxyethanol's higher boiling point allows it to remain behind while $H_2O$ boils away. Thus, the resulting precursor is essentially anhydrous. Barium and strontium 2-ethylhexanoate are used because thin films formed utilizing medium chain length carboxylates like these in the precursors do not crack, blister or peel on baking as do the thin films formed utilizing longer-chain carboxylates. Strontium and barium 2-methoxyethoxides were tried, but proved excessively air- and water-sensitive. Titanium 2-methoxyethoxide gives better films than the air-insensitive titanium 2-ethylhexanoate, but while titanium 2-methoxyethoxide is air-sensitive, it is less air-sensitive than titanium isopropoxide.

The BST precursor formed as described above was used in the method of the invention shown in FIG. 6, with the apparatus of the invention shown in FIGS. 1–5 and 7–10, to fabricate a capacitor as shown in FIG. 11.

A BST precursor as described above was placed in container 54 of mist generator 46-1 (FIG. 7), and a 2-methoxyethanol solvent was place in container 54 of mist generator 46-2. Initially, a substrate comprising a silicon wafer with layers of silicon dioxide and platinum deposited on it was pre-baked in an oven at atmospheric pressure (@ Colorado Springs, Colo.) at 180° C. for 10 minutes. The substrate was placed in the deposition chamber on the substrate holder 4. The deposition chamber was pumped down to 0.4 Torr via a rough pump (not shown) connected to valve 726. Next, substrate rotation motor 18 was turned on to rotate substrate holder 4. UV source 16 was then turned on to desorb the moisture in the deposition chamber as well as any moisture on the substrate. The deposition chamber was slowly back filled via valves 727 and 707 with an inert gas source 704 such as argon or nitrogen to a pressure of approximately 595 Torr. Next, the process vacuum line 702 was opened to stabilize the deposition chamber pressure at approximately 595 Torr. Valve 725-6 was closed and injection valve 725-1 and deposit valves 725-4 and 725-5 were then opened to start the flow of argon from source 736 through ultrasonic mist generator 46-2 which was then turned on for one minute to cause a thin film of approximately 100 angstroms of primer to be deposited at ambient temperature on the substrate. Deposit valve 725-1 was then closed, valve 725-6 was then opened and the transducer 56 associated with mist generator 46-2 was turned off, to vent buffer chamber 42 through vent 705 until mist generator 46-2 reached ambient temperature. Buffer chamber 42 was purged through vent 705 by applying argon gas from source 736. Then valves 725-4 and 725-5 were closed. Deposit valve 725-1 was reopened and valves 725-3 and 725-2 were also opened to flow argon from source 736 through ultrasonic mist generator 46-1 which was then turned on for 10 minutes to cause a film of approximately 600 Angstroms to be deposited at ambient temperature on the substrate. The deposition process used argon carrier gas to flow both the primer mist and the BST precursor mist over the substrate 5. After a sufficient amount of the BST precursor was deposited on the substrate to produce a thin film, the mist generator 46-1, and the substrate rotation motor were turned off. Deposit valve 725-1 was closed and valve 725-6 was opened to vent buffer chamber 42 through vent 705 until mist generator 46-1 reached ambient temperature. Buffer chamber 42 was purged through vent 705 by applying argon gas from source 736. While the wafer remained in the deposition chamber, the chamber was slowly pumped down to 0.4 Torr. The UV source 16 was then turned off. Next, valve 713 was closed and the deposition chamber was vented to atmospheric pressure. The wafer was then removed from the deposition chamber and post-baked at 400° C. for two minutes. The wafer was then annealed in an oxygen atmosphere at 800° C. for 80 minutes. The wafer was then etched using well-known photo-resist techniques to produce a plurality of electronic devices 1112. A sample made by this process is referred to below as sample A.

The above process was repeated for another sample, referred to as sample B, except that step P8 was skipped. That is, for sample B, no primer was applied, and the BST precursor was applied directly to the substrate 5.

Figure 13:
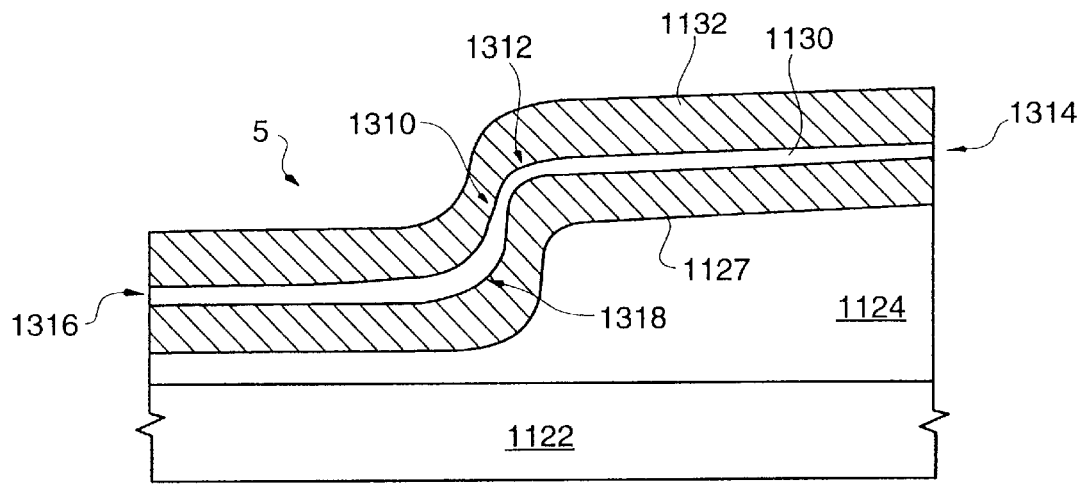
FIG. 13 is a drawing of an electron micrograph of a cross-section of a BST capacitor made using a primer.
Figure 14:
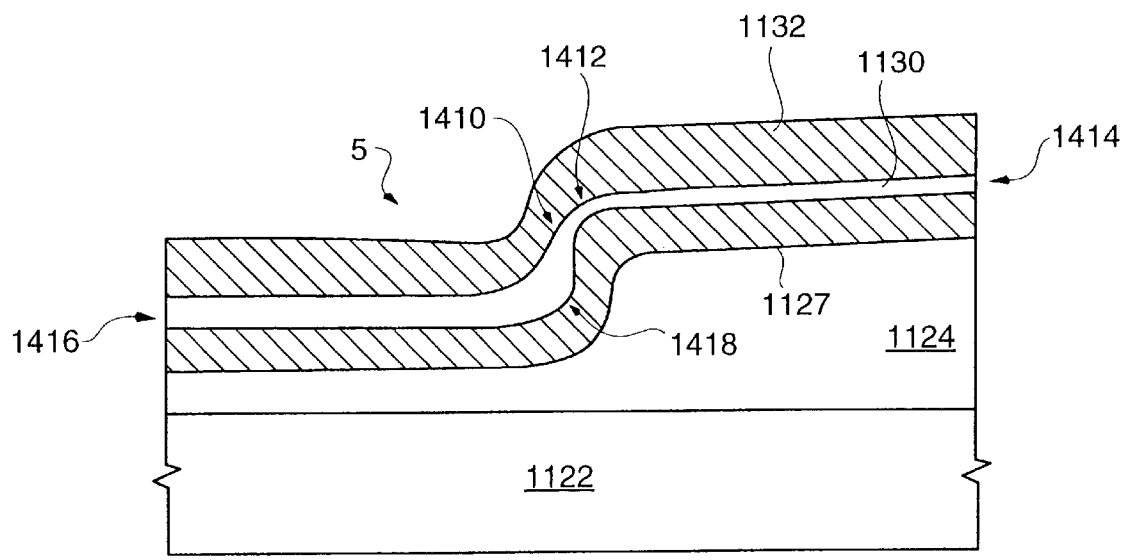
FIG. 14 is a drawing of an electron micrograph of a cross-section of a BST capacitor made without using a primer.

Both the A and B devices were made with half of the wafer comprising flat capacitors as shown in FIG. 11, and the other half of the wafer comprising a series of steps up and down between two different levels, as illustrated in FIGS. 13 and 14.

Figure 12:
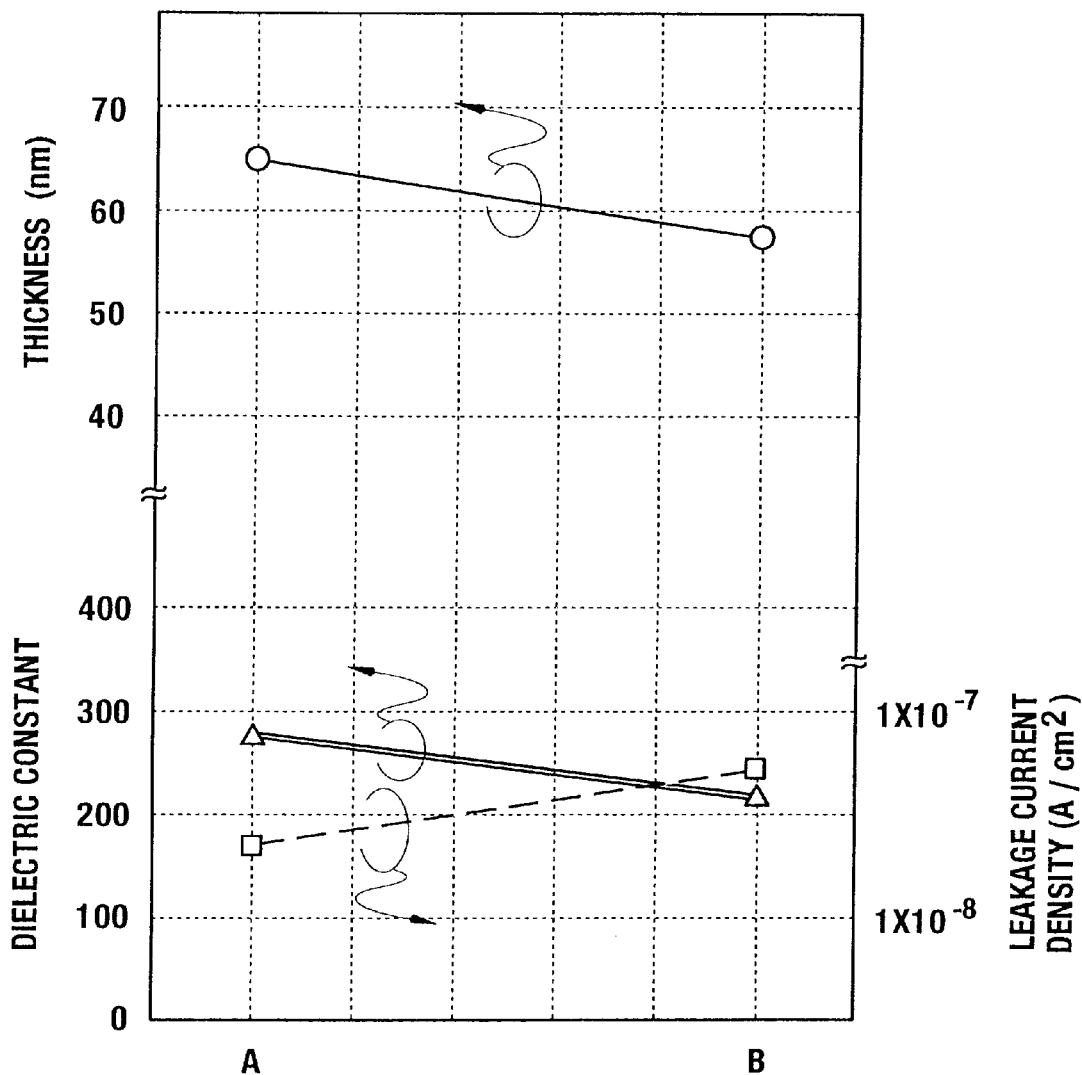
FIG. 12 is a graph comparing the film thickness of a BST thin film, the dielectric constant of the BST thin film, and the leakage current of a capacitor made with the BST thin film for a BST thin film made using a primer and a BST film made without a primer.

The thickness of the BST thin film 1130, the dielectric constant of the BST thin film 1130, and the leakage current density across the BST thin film 1130, were measured for capacitor samples A and B that were formed in the flat capacitor half of the wafer as fabricated in each of the two processes. In each case, the electric field for which the leakage current was measured was 500 kilovolts per centimeter. The results are shown in FIG. 12 as a function of the sample. The scale for the leakage current density is on the right in the figure, and is given in amperes per square centimeter. The scale for the dielectric constant is given on the left in the figure. The dielectric constant was significantly higher for the sample A for which the primer was applied, improving by over 100, i.e. a third. The leakage current density was 2.2×10–8 amps/cm2 for the sample for which the primer was applied as compared to 6×10–8 for the sample B for which no primer was used. These results indicate that use of primer significantly improves the electrical characteristics that are critical for integrated circuit performance.

The surface morphology and step coverage characteristics were observed for each of the capacitors A and B. A micrograph was taken of each flat surface. The surface of the sample A in which the primer was used was smooth and had but a single small pinhole defect. The surface was easily smooth enough for manufacture of integrate circuit devices. The surface of the sample B in which no primer was used had a multitude of pinhole defects and many areas in which the film was disconnected. The surface was far from suitable for the manufacture of reliable integrated circuits.

FIGS. 13 and 14 are drawings of electron micrographs of a portion of the actual device of samples A and B, respectively, taken in the area of a step in the capacitor structure. That is, FIG. 13 shows an electron micrograph of a cut through a capacitor fabricated using the primer before deposition of a BST dielectric, while FIG. 14 shows an electromicrograph of a cut through a capacitor fabricated without using the primer before deposition of a BST dielectric. In both instances, the device was as described in reference to FIG. 11, except for the step structure, i.e. it included a silicon wafer 1122, a layer 1124 of $SiO_2$, a bottom electrode 1127, a layer 1130 of BST, and an upper electrode 1132 of platinum. The bottom electrode is shown in a single layer rather than the separate layer of titanium and platinum, since after annealing they diffuse into one another at their interface and in the electron micrograph they are essentially indistinguishable.

In each FIG., a step 1310, 1410 was formed in layer 1124 over which the bottom electrode 1127 was deposited, followed by a layer 1130 of BST. Comparing FIG. 13 with FIG. 14, the thickness of the BST layer 1130 is much more uniform. In the "higher" portion 1314 of the step 1310, the thickness was measured to be 45 nanometers (nm), while in the "lower" portion 1314 of the step 1310 the thickness was measured to be 52 nm, a difference of 7 nm. In comparison, in FIG. 14, in the higher portion 1414 the thickness was measured to be 51 nm, while in the lower portion 1416 the thickness was measured to be 78 nm, a difference of 27 nm. In FIG. 13, the BST follows the contour of the step better, with the difference between the thinnest point 1312 and the thickest point 1318 being considerably smaller than the difference between the points 1412 and 1418 in FIG. 14. Finally, the layer 1130 is overall thinner in FIG. 13. The features show that for very thin films, the dielectric formed with the primer is much superior. For thicker films the relative differences become less pronounced, though still exist. The quality and reliability of the process for thicker films is also significantly enhanced when a primer is used. It is understood that the surface tension difference between the process with and without the primer can generally explain the differences that result.

An anomaly is observed in comparing FIG. 12 and FIGS. 13 and 14. In the flat area of the wafer, the dielectric 1130 formed using the primer is thicker, while in the stepped area of the wafer, the dielectric 1130 formed without the primer is thicker. This is not entirely understood, though it can be explained as follows: In the case of the flat area, the thickness was measured using an isoscope, while in the stepped areas the thickness was measured by measurements taken from the electron micrograph. These two forms of measurement are not completely consistent, and it may be that, for the process using the primer, the actual thickness in the flat and stepped area is essentially the same, or at least a lot closer than indicated in FIG. 12 and FIG. 13. If at the same time, the precursor tended to gather in the low areas more in the case of the unprimed process, then the differences between FIG. 12 and FIGS. 13 and 14 would be accounted for.

An important feature to notice in the above examples, is that high quality BST thin films of about 50 nanometers thick suitable for use in an integrated circuit were produced by the process of the invention. No prior art process is known that has successfully produced BDT thin films of such high quality and such thinness. In prior art misted deposition processes, BST films generally were required to be significantly thicker if dielectrics suitable for integrated circuit use were to be successfully made. Other processes, such as sputtering, require even thicker films if integrated circuit quality is to be obtained.

Another deposition process was performed that was identical to the process described in the example above except that the primer step P8 was performed simultaneously with the precursor deposition step P22. That is, both mist generators 46-1 and 46-2 were turned on and valves 725-1, 725-2, 725-3, 725-4 and 725-5 were all open simultaneously, and the precursor and primer mists were mixed in the buffer chamber 42 before entering the deposition chamber 12. Then valve 725-1 was closed, the mist generators 46-1 and 46-2 were turned off, valve 725-6 was opened and both mist generators 46-1 and 46-2 were vented to atmosphere until they cooled to ambient temperature. This process also produced better morphology and better leakage current than the process with no primer, though not as good as the results with the results with steps P8 and P22 performed separately. It is believed that when more experience with the deposition process parameters is gained with this process, it may become the preferred process.

The invention is advantageous in depositing complex, thin films of materials such as ferroelectrics, superconductors, materials with high dielectric constants, gems, etc., but is not limited to depositing such complex thin films.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

What is claimed is:

1. A method of fabricating an integrated circuit, said method comprising the steps of:
   (a) providing a liquid primer;
   (b) providing a liquid precursor;
   (c) placing a substrate inside an enclosed deposition chamber;
   (d) producing a primer mist of said liquid primer;
   (e) flowing said primer mist through said deposition chamber to form a layer of said primer liquid on said substrate;
   (f) producing a precursor mist of said liquid precursor;
   (g) flowing said precursor mist through said deposition chamber to form a layer of said precursor liquid on said substrate;
   (h) treating said liquid layers deposited on the substrate to form a film of solid material; and
   (i) completing the fabrication of said integrated circuit to include at least a portion of said film of solid material in a component of said integrated circuit, maintaining a vacuum in said deposition chamber.

2. The method of claim 1 wherein said liquid primer comprises a primer solvent.

3. The method of claim 2 wherein said primer solvent comprises a solvent selected from the group: 2-methoxyethanol, xylenes, and n-butyl acetate.

4. The method of claim 3, wherein said precursor comprises a metal compound in a precursor solvent, said metal compound selected from the group: a metal alkoxide and a metal carboxylate, and a metal alkoxycarboxylate.

5. The method of claim 4 wherein said precursor solvent is the same as said primer solvent.

6. The method of claim 1, wherein said step of flowing said primer mist into said deposition chamber is performed while maintaining said substrate at ambient temperature.

7. The method of claim 1, wherein said steps of flowing said primer mist into said deposition chamber and flowing said precursor mist into said deposition chamber are performed simultaneously.

8. The method of claim 1, wherein said step of flowing said primer mist into said deposition chamber is performed while maintaining a vacuum in said deposition chamber.

9. The method of claim 8, wherein said vacuum is between approximately 100 Torr and 800 Torr.

10. The method of claim 1, wherein said step of flowing said precursor mist into said deposition chamber is performed while maintaining a vacuum in said deposition chamber.

11. The method of claim 10, wherein said vacuum is between approximately 100 Torr and 800 Torr.

12. The method of claim 1, wherein said primer mist is an aerosol.

13. The method of claim 1, wherein said precursor mist is an aerosol.

14. The method of claim 1 and further including the step of filtering said primer mist prior to said step of flowing.

15. The method of claim 14 wherein said step of filtering comprises passing said primer mist through openings having an area of up to one micron.

16. The method of claim 1 and further including the step of filtering said precursor mist prior to said step of flowing.

17. The method of claim 16 wherein said step of filtering comprises passing said precursor mist through openings having an area of up to one micron.

18. The method of claim 1, wherein said step of flowing said primer mist comprises injecting said primer mist into said deposition chamber around the periphery of one side of said substrate and exhausting said primer mist from said deposition chamber at a region around the periphery of an opposite side of said substrate to create a substantially evenly distributed flow of said primer mist across the substrate.

19. The method of claim 1, wherein said step of flowing said precursor mist comprises injecting said precursor mist into said deposition chamber around the periphery of one side of said substrate and exhausting said precursor mist from said deposition chamber at a region around the periphery of an opposite side of said substrate to create a substantially evenly distributed flow of said precursor mist across the substrate.

20. The method of claim 1, wherein a surface of said substrate defines a substrate plane and said primer and precursor mists are flowed between said substrate and a barrier plate located within said deposition chamber in a spaced relation to said substrate and parallel to said substrate plane.

21. The method of claim 20, wherein said barrier plate is adjustable to vary the distance between the barrier plate and the substrate.

22. The method of claim 20 wherein said barrier plate has a smoothness tolerance of 5% of the average distance between said barrier plate and said substrate.

23. The method of claim 20 wherein the area of said barrier plate in a plane parallel to said substrate differs from the area of said substrate in said plane by up to 10% of said area of said substrate.

24. The method of claim 20 wherein the area of said barrier plate in a plane parallel to said substrate is substantially equal to the area of said substrate in said plane.

25. The method of claim 1, including the additional step of rotating said substrate in a plane parallel to a surface of said substrate while said primer and precursor mists are flowing over the substrate.

26. The method of claim 1, including the additional step of mixing a plurality of different primer mists external of said deposition chamber to form a primer mist mixture to be flowed into the deposition chamber.

27. The method of claim 1, including the additional step of applying ultraviolet radiation to one of said primer mist and said precursor mist while said mist is flowing through the deposition chamber.

28. The method of claim 1, wherein said step of treating comprises applying ultraviolet radiation to one of said primer layer and said precursor layer deposited on said substrate.

29. The method of claim 1, including the step of applying a DC bias between said deposition chamber and said substrate.

30. The method of claim 1, wherein said step of producing a primer mist comprises ultrasonically vibrating a quantity of said liquid primer to form said primer mist.

31. The method of claim 30 wherein said step of ultrasonically vibrating comprises adjusting the particle size of said primer mist by controlling one of the frequency and amplitude of said ultrasonic vibration.

32. The method of claim 1, wherein said step of producing a precursor mist comprises ultrasonically vibrating a quantity of said liquid precursor to form said precursor mist.

33. The method of claim 32 wherein said step of ultrasonically vibrating comprises adjusting the particle size of said precursor mist by controlling one of the frequency and amplitude of said ultrasonic vibration.

34. The method of claim 1, wherein said step of treating includes one or more steps from the group of drying, heating and annealing said layer deposited on said substrate.

35. The method of claim 1 wherein said step of treating comprises drying said liquid primer and said liquid precursor layers deposited on said substrate.

36. The method of claim 35 wherein said step of drying comprises maintaining a sub-atmospheric pressure in said deposition chamber.

37. A method of fabricating an integrated circuit, said method comprising the steps of:

(a) providing a liquid primer;

(b) providing a liquid precursor;

(c) placing a substrate inside an enclosed deposition chamber;

(d) producing a primer mist of said liquid primer;

(f) producing a precursor mist of said liquid precursor;

(e) flowing said mists through said deposition chamber to form a liquid mixture of said primer and precursor on said substrate;

(h) treating said liquid mixture deposited on the substrate to form a film of solid material; and (i) completing the fabrication of said integrated circuit to include at least a portion of said film of solid material in a component of said integrated circuit.

38. The method of claim 37 wherein said liquid primer comprises a primer solvent.

39. The method of claim 38 wherein said primer solvent comprises a solvent selected from the group: 2-methoxyethanol, xylenes, and n-butyl acetate.

40. The method of claim 39, wherein said precursor comprises a metal compound in a precursor solvent, said metal compound selected from the group: a metal alkoxide, a metal carboxylate, and a metal alkoxycarboxylate.

41. The method of claim 40 wherein said precursor solvent is the same as said primer solvent.

42. The method of claim 37, wherein said step of flowing said mists into said deposition chamber is performed while maintaining said substrate at ambient temperature.

43. The method of claim 37, wherein said step of flowing primer mists into said deposition chamber is performed while maintaining a vacuum in said deposition chamber.

44. The method of claim 38, wherein said vacuum is between approximately 100 Torr and 800 Torr.

* * * * *

UNITED STATES PATENT AND TRADEMARK OFFICE
CERTIFICATE OF CORRECTION

PATENT NO : 5,972,428
DATED : October 26, 1999
INVENTOR(S) : Shinichiro Hayashi et al.

It is certified that error appears in the above-identified patent and that said Letters Patent are hereby corrected as shown below:

On title page, item 73 Assignees
replace "Symetrix Corporation, Colorado Spring, Colorado"
with --Symetrix Corporation, Colorado Springs, Colorado--.

Signed and Sealed this

Twenty-fifth Day of July, 2000

Attest:

Q. TODD DICKINSON

*Attesting Officer*              *Director of Patents and Trademarks*